United States Patent [19]

Bartlow

[11] Patent Number: 5,329,156
[45] Date of Patent: Jul. 12, 1994

[54] FEED BUS FOR RF POWER TRANSISTORS

[75] Inventor: Howard D. Bartlow, Wilsonville, Oreg.

[73] Assignee: Spectrian, Inc., Mountain View, Calif.

[21] Appl. No.: 994,745

[22] Filed: Dec. 22, 1992

[51] Int. Cl.⁵ ............................................. H01L 29/72
[52] U.S. Cl. .................................... 257/579; 257/266; 257/341; 257/773; 257/786; 257/923
[58] Field of Search ............... 257/266, 341, 579, 773, 257/786, 923

[56] References Cited

U.S. PATENT DOCUMENTS 3,623,218  11/1971  Mitarai et al. ...................... 251/579

FOREIGN PATENT DOCUMENTS 60-192364  9/1985  Japan .................................. 257/579

Primary Examiner—Edward Wojciecouwicz
Attorney, Agent, or Firm—Townsend and Townsend Khourie and Crew

[57] ABSTRACT

The feeds to the emitter, base, and collector of an RF power transistor (source, drain, gate feeds of an RF FET) are configured so that negative mutual coupling therebetween is enhanced and positive mutual coupling therebetween is reduced. The emitter and base feeds include elongated portions which are generally parallel to each other with bonding pads provided on the elongated portions so that emitter and base currents flow in the same direction in the elongated portions and in the same direction as collector currents below. Interdigitated contact fingers extend from the elongated portions and contact the emitter region and the base region, respectively. When positive coupling of collector current and emitter current to the controlling base current is reduced or eliminated, the major thermal imbalance problem of operating RF transistors is also reduced or eliminated. Performance, linearity, efficiency, gain, and ruggedness are all enhanced in devices designed to utilize this invention.

9 Claims, 2 Drawing Sheets

FEED BUS FOR RF POWER TRANSISTORS

This invention is related to copending application 14987-11 for Venetian Blind Cell Layout for Power Transistor assigned to Spectrian, Inc., present assignee.

BACKGROUND OF THE INVENTION

This invention relates generally to RF and power transistors, and more particularly the invention relates to a feed bus for such transistors which reduces thermal gradients.

FIG. 1 is a schematic of a bipolar NPN transistor having emitter and collector regions separated by a base region. Applying Kirchoff's current law, emitter current, $I_e$, equals the sum of base current, Ib, and collector current, $I_c$.

Typically, emitter and base contacts are provided on one (the front) surface of the transistor and the collector contact is made to the opposing (the back) surface as shown in FIG. 2, with base and emitter wire bonding pads positioned centrally in the metal contact structure and with current flowing to and from interdigitated finger contacts as shown.

The bipolar transistor current relationships introduce mutual magnetic coupling due to magnetic flux linkage between currents. As illustrated in FIG. 3, parallel currents flowing in the same direction produce negative magnetic coupling with the currents tending to oppose each other. However, when the parallel currents flow in opposite directions as shown in FIG. 4, mutual coupling is enhanced or positive and the currents tend to support each other.

Referring again to the conventional bipolar contact structure shown in FIG. 2, current Ib1 receives positive coupling from both Ic and Ie1. Current Ib2 receives positive coupling from Ie2 and negative coupling from Ic. Since current proximity is very important to these coupling effects, the dominant mode occurs when Ib couples to Ic. Consequently, the transistor contact structure shown in FIG. 2 will most often run hot on the output side where maximum coupling occurs, unless unusual and deleterious compensations are employed. The transistor base current (the "controlling" current) is enhanced (with positive coupling) which then continuously increases emitter and collector current and consequent heating. If the resulting thermal gradient becomes sufficiently high, then efficiency, linearity, and power output will suffer and eventually the transistor may destroy itself.

A common compensation is to increase transistor "ballasting" (series emitter resistors for sites and fingers) to swamp or at least reduce the transistor output overheating effect. Although increased ballasting improves the current sharing and uniformity, transistor gain and frequency performance suffer significantly if ballasting sufficient to minimize overheating is utilized. Without increased ballasting, load mismatch ruggedness and stability are severely compromised. Such a transistor without adequate compensation will be prone to thermal runaway and may destroy itself. This tradeoff has been a singularly difficult problem with high power, higher frequency devices.

SUMMARY OF THE INVENTION

In accordance with the present invention, an RF power transistor is provided with a feed structure wherein negative mutual coupling between currents is enhanced and positive mutual coupling is reduced, thereby reducing hot spots in RF power transistors due to positive mutual coupling of currents.

In a preferred embodiment, the emitter and base bonding pads of a bipolar transistor are located so that emitter and base currents tend to flow in the same direction thereby creating negative mutual magnetic flux coupling between. Similarly, in a field effect transistor, the gate and source currents tend to flow in the same direction thereby creating negative mutual magnetic flux coupling therebetween.

The invention and objects and feature thereof will be more readily apparent from the following detailed description and appended claims when taken with the drawing.

DETAILED DESCRIPTION OF THE ILLUSTRATED EMBODIMENT

Figure 1:
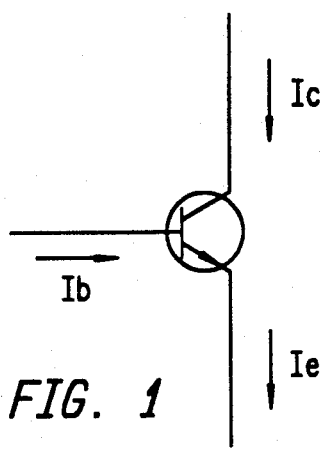
FIG. 1 is a schematic of an NPN bipolar transistor illustrating emitter, base, and collector currents.
Figure 2:
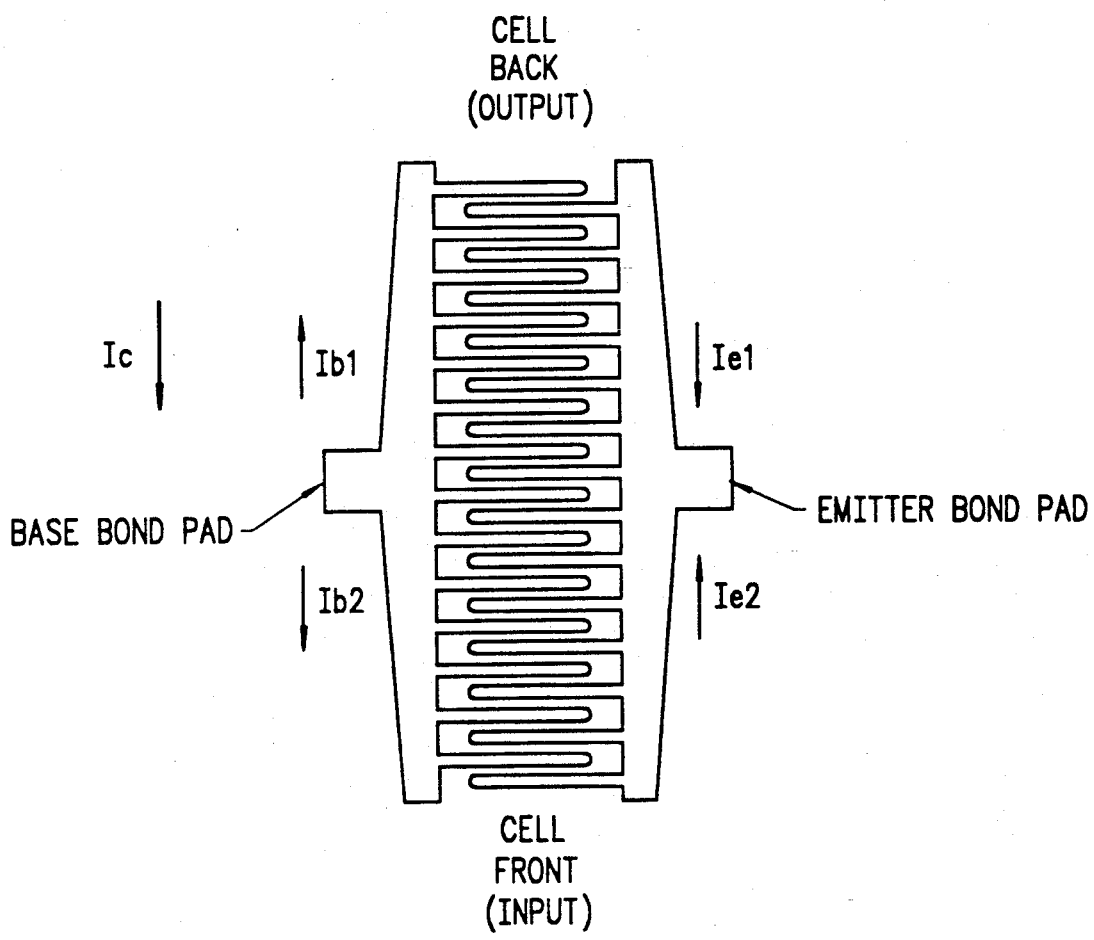
FIG. 2 is plan view of a conventional feed structure for a bipolar transistor.
Figure 3:
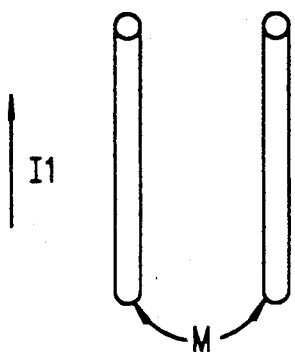
FIG. 3 and FIG. 4 are schematics illustrating negative and positive mutual coupling between two parallel currents.
Figure 4:
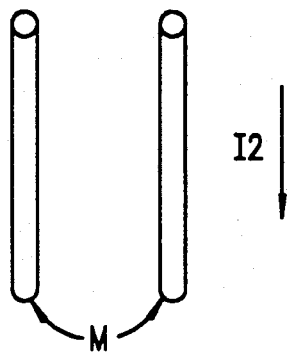
Figure 5:
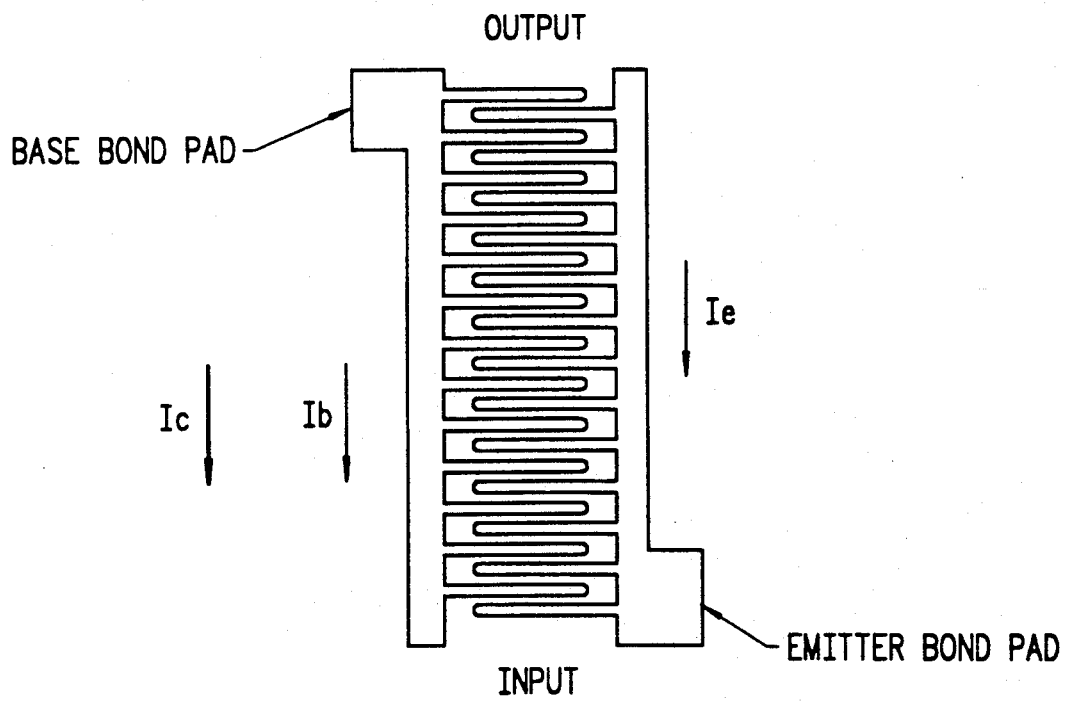
FIG. 5 is a plan view of a feed structure for a bipolar transistor in accordance with a preferred embodiment of the invention.

Referring now to FIG. 5, a plan view of a metallic feed structure for a bipolar transistor in accordance with one embodiment of the invention is illustrated. The feed structure is configured so that all currents tend to flow in the same direction. This is readily accomplished in the illustrated embodiment by relocating the bonding pads for the base and emitter contacts. Note that all currents tend to flow in the same direction. Therefore, both $I_c$ and $I_b$ now have negative mutual feedback to $I_b$ and to each other for much improved cell feed uniformity and thermal balance. Thus, an emitter contact located near the back of the cell has the same current as an emitter contact located near the front of the cell. The controlling base currents are analogously equal. Expressing the current stabilization mathematically:

$$\Box . Ib = 0$$

and $$\} . Ie = 0$$

where $\Box$ is the del operator and, in rectangular coordinates, is defined as:

$$\nabla = \frac{\partial}{\partial x} ax + \frac{\partial}{\partial y} ay + \frac{\partial}{\partial z} az$$

The base and emitter currents are now constant over space. Equal currents in given regions will have equal temperatures in the same regions. Thus:

$$\} . T(x,y) = 0$$

where $T(x,y)$ describes the temperature as a function of space.

Accordingly, by enhancing negative coupling of currents in an RF power transistor, hot spots in the transistor are reduced or eliminated thereby increasing the performance of the transistor and the mean time to failure of the device.

While the invention has been illustrated with reference to a specific bipolar transistor embodiment, the description is illustrative of the invention and is not to be construed as limiting the invention. The invention encompasses RF power field effect transistors, also, by creating negative mutual magnetic coupling between the RF gate current to the drain and source current. Thus, various modifications and applications may occur to those skilled in the art without departing from the true spirit of the invention as defined in the claims.

What is claimed is:

1. An RF power transistor structure comprising a semiconductor body having a first (collector/drain) region and a second (emitter/source) region separated by a third (base/channel) region, a feed bus structure on one surface of said semiconductor body for feeding said second region and controlling said second region, said feed bus structure being configured so that third region current and second region current in said feed structure tend to flow parallel to each other and parallel to first region current and in the same direction to thereby enhance negative mutual coupling therebetween and reduce positive mutual coupling therebetween.

2. A bipolar RF power transistor structure comprising a semiconductor body having a collector region and an emitter region separated by a base region, a feed bus structure on one surface of said semiconductor body for feeding said emitter region and said base region, said feed bus structure being configured so that emitter current and base current in said feed structure tend to flow parallel to each other and parallel to collector current in said semiconductor body and in the same direction to thereby enhance negative mutual coupling therebetween and reduce positive mutual coupling therebetween.

3. The bipolar RF power transistor structure as defined in claim 2 wherein said feed bus structure includes a first elongated portion for carrying emitter current and a second elongated portion for carrying base current, an emitter bonding pad near one end of said first elongated portion, and a base bonding pad near one end of said second elongated portion opposite from said one end of said first elongated portion.

4. The bipolar RF power transistor structure as defined by claim 3 wherein said feed bus structure further includes a first plurality of contact fingers extending from said first elongated portion, and a second plurality of contact fingers extending from said second elongated portion.

5. The bipolar RF power transistor structure as defined by claim 4 wherein said first plurality of contact fingers and said second plurality of contact fingers are interdigitated.

6. The bipolar RF power transistor structure as defined by claim 5 and further including a collector contact on the surface of said semiconductor body opposing said one surface.

7. The bipolar RF power transistor structure as defined by claim 2 and further including a collector contact on a surface of said semiconductor body opposing said one surface.

8. A method of reducing hot spots in an RF bipolar power transistor having an emitter current, a base current, and an collector current during operation, said method comprising the step of configuring a feed bus structure to said emitter and said base whereby said emitter current, said base current, and said collector current tend to flow in parallel and in the same direction so that mutual magnetic coupling therebetween is negative.

9. A method of reducing hot spots in an RF field effect power transistor having a source current, a gate current, and a drain current during operation, said method comprising the step of configuring a feed bus structure to said source and said gate whereby said drain current, said gate current, and said source current tend to flow in parallel and in the same direction so that mutual magnetic coupling therebetween is negative.

* * * * *